(12) United States Patent
Yoshida

(10) Patent No.: US 6,777,339 B2
(45) Date of Patent: Aug. 17, 2004

(54) METHOD FOR PLANARIZING DEPOSITED FILM

(75) Inventor: Hideaki Yoshida, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/101,829

(22) Filed: Mar. 21, 2002

(65) Prior Publication Data

US 2003/0232469 A1 Dec. 18, 2003

(30) Foreign Application Priority Data

Jul. 17, 2001 (JP) ........................................ 2001-216446

(51) Int. Cl.⁷ ............................................ H01L 21/302
(52) U.S. Cl. ..................................................... 438/692
(58) Field of Search ................................ 438/692, 631, 438/633, 424

(56) References Cited

U.S. PATENT DOCUMENTS 6,184,141 B1 * 2/2001 Avanzino et al. ........... 438/692
6,204,169 B1 * 3/2001 Bajaj et al. .................. 438/645
6,261,158 B1 * 7/2001 Holland et al. ............... 451/63
6,620,725 B1 * 9/2003 Shue et al. .................. 438/633

* cited by examiner

*Primary Examiner*—David Nelms
*Assistant Examiner*—Quoc Hoang
(74) *Attorney, Agent, or Firm*—McDermott Will & Emery LLP

(57) ABSTRACT

After forming a groove in a surface portion of a substrate, a deposited film is formed on the substrate so as to fill the groove. The deposited film is subjected to a first stage of chemical mechanical polishing with a relatively high rotation speed and a relatively low pressure, so as to eliminate an initial level difference formed in the deposited film due to the groove. After eliminating the initial level difference, the deposited film is subjected to a second stage of the chemical mechanical polishing with a relatively low rotation speed and a relatively high pressure, so as to remove a portion of the deposited film present outside the groove.

14 Claims, 13 Drawing Sheets

METHOD FOR PLANARIZING DEPOSITED FILM

BACKGROUND OF THE INVENTION

The present invention relates to a method for planarizing a deposited film by chemical mechanical polishing for use in production of a semiconductor device. More particularly, it relates to a method for forming a buried interconnect in a multi-layer interconnect process or forming an isolation region in an isolation process.

A method for forming a buried interconnect by the chemical mechanical polishing (CMP) will now be described as a conventional example with reference to FIGS. 11A through 11C and 12A through 12C.

First, as shown in FIG. 11A, an interconnect groove 3 is formed by photolithography and dry etching in an interlayer insulating film 2 of silicon dioxide deposited on a semiconductor substrate 1. Thereafter, as shown in FIG. 11B, a barrier metal layer 4 of, for example, a tantalum nitride film is formed over the interlayer insulating film 2 including the inside faces of the interconnect groove 3. The barrier metal layer 4 is thus formed in a small thickness over the interlayer insulating film 2 because copper used for forming a copper interconnect can easily diffuse into the silicon dioxide film of the interlayer insulating film 2 so as to degrade the insulating property of the interlayer insulating film 2.

Next, as shown in FIG. 1C, a seed layer 5 of copper is formed on the barrier metal layer 4 by sputtering, and then, the seed layer 5 is grown into a copper film 6 by electroplating as shown in FIG. 12A. In this case, the copper film 6 is grown to have a thickness larger than the depth of the interconnect groove 3 so that the interconnect groove 3 can be completely filled with the copper film 6. Thus, an initial level difference 7 is formed in the copper film 6 above the interconnect groove 3.

Then, as shown in FIG. 12B, an excessive portion of the copper film 6 present outside the interconnect groove 3 is removed by the CMP, thereby forming a buried interconnect 6A from the copper film 6. Finally, a portion of the barrier metal layer 4 present above the interlayer insulating film 2 is removed by the CMP as shown in FIG. 12C.

Since tantalum nitride used for forming the barrier metal layer 4 for preventing diffusion of copper is a very stable material, it is difficult to simultaneously remove the copper film 6 and the barrier metal layer 4 by the CMP.

Accordingly, in order to form the buried copper interconnect 6A, the copper film 6 and the barrier metal layer 4 should be separately polished. Specifically, at a first stage of the CMP, the copper film 6 alone is removed by the polishing and the polishing is stopped at the surface of the barrier metal layer 4. A slurry used at the first stage of the CMP preferably has a polishing rate for tantalum nitride sufficiently higher than that for copper. Then, at a second stage of the CMP, the portion of the barrier metal layer 4 present above the interlayer insulating film 2 is removed by using a slurry suitable for polishing tantalum nitride. The slurry used at the second stage of the CMP preferably has a polishing rate for copper equivalent to or lower than that for tantalum nitride. Through the CMP thus carried out in the two stages, the buried interconnect 6A can be formed without eliminating the copper film 6.

FIG. 13A shows an ideal cross-sectional shape of the buried copper interconnect 6A, and FIG. 13B shows an actual cross-sectional shape of the buried copper interconnect 6A. Specifically, the copper film 6 is polished during the CMP until the top face of the buried copper interconnect 6A is placed at a level lower than that of the interlayer insulating film 2. Accordingly, a plane face as shown in FIG. 13A cannot be obtained but unevenness designated as dishing is caused on the buried interconnect 6A as shown in FIG. 13B.

When the dishing is caused on the buried interconnect 6A, a variety of problems may occur as follows: Since the height of the buried interconnect 6A is lowered, the interconnect resistance may be increased. In forming a multi-layer interconnect structure, polishing residue of a copper film or a tantalum nitride film may be caused in a buried interconnect in an upper layer, which can cause short-circuit of the interconnect or can increase focal shift in the photolithography so as to cause a pattern defect.

Accordingly, in order to form a high performance buried interconnect, it is very significant to reduce dishing caused on the buried interconnect 6A.

Alternatively, in forming an isolation region by filling an isolation groove with an insulating film in the isolation process, dishing may be caused on the isolation region. In this case, the isolation region is reduced in its thickness, and hence, a leakage defect may be caused between devices to be isolated or a pattern defect may be caused.

Accordingly, in order to form a high performance isolation region, it is very significant to reduce dishing caused on the isolation region.

There are some known causes for increase of dishing, against which countermeasures have been considered.

For example, the dishing tends to increase as the width of an interconnect is increased. This is because of elastic deformation of a polishing pad, and the upper limit in the width of an interconnect is provided at the stage of circuit design as the countermeasure.

Also, the dishing tends to increase as the polishing pad is softer. This is also because of the elastic deformation of the polishing pad, and a hard polishing pad is used as the countermeasure.

Furthermore, the dishing tends to increase as overpolishing is increased. The over-polishing is performed at the ultimate stage of the polarization process in order to completely remove an excessive portion of the copper film partly remaining on the substrate surface. The overpolishing is effective means for preventing short-circuit of an interconnect derived from polishing residue of the copper film and hence is indispensable, but excessive overpolishing may increase the dishing so as to increase the interconnect resistance and cause polishing residue in a buried interconnect in an upper layer. Therefore, the overpolishing should be sufficiently carefully performed. In other words, the over-polishing should be performed to a necessary and minimum extent. Excessive over-polishing is performed because of in-plane variation in the thickness of the deposited copper film and in-plane variation in the polishing rate in the CMP. Therefore, when such in-plane variations are reduced, the over-polishing can be avoided so as to reduce the dishing.

Another cause of increase of the dishing is the thickness of the copper film. Specifically, when the copper film has a too small thickness, an interconnect pattern is exposed before completely eliminating the initial level difference, and hence, the remaining initial level difference directly leads to the dishing of the interconnect. On the other hand, when the copper film has a too large thickness, the in-plane variation in the thickness of the copper film and the in-plane variation in the polishing rate in the CMP are both caused, and hence, the over-polishing is increased so as to increase the dishing.

SUMMARY OF THE INVENTION

In consideration of the aforementioned problems, an object of the invention is reducing dishing caused in completing over-polishing in the CMP.

In order to achieve the object, the method for planarizing a deposited film of this invention comprises the steps of forming a groove in a surface portion of a substrate; forming a deposited film on the substrate so as to fill the groove; eliminating an initial level difference formed in the deposited film due to the groove by subjecting the deposited film to a first stage of chemical mechanical polishing with a relatively high rotation speed and a relatively low pressure; and removing a portion of the deposited film present outside the groove after eliminating the initial level difference by subjecting the deposited film to a second stage of the chemical mechanical polishing with a relatively low rotation speed and a relatively high pressure.

In the method for planarizing a deposited film of the invention, since the first stage of the chemical mechanical polishing is performed with a relatively high rotation speed and a relatively low pressure, the deposited film can be planarized in a short polishing time, so as to improve the planeness of the deposited film attained in completing the first stage of the chemical mechanical polishing. Also, since the second stage of the chemical mechanical polishing is performed with a relatively low rotation speed and a relatively high pressure, the portion of the deposited film present outside the groove can be removed in a short polishing time, so as to suppress dishing.

In the method for planarizing a deposited film, the deposited film preferably has a thickness 1.6 through 2.0 times as large as a depth of the groove.

Thus, surface unevenness caused in completing the first stage of the chemical mechanical polishing can be suppressed to 20 nm or less, and the time required for the second stage of the chemical mechanical polishing can be shortened. As a result, the dishing can be suppressed.

In the method for planarizing a deposited film, the first stage of the chemical mechanical polishing is preferably performed until a thickness of the deposited film remaining on the substrate becomes larger than zero and not larger than 50% of a depth of the groove.

Thus, the time required for the second stage of the chemical mechanical polishing can be shortened, so as to reduce in-plane variation in the thickness of the deposited film caused during the second stage of the chemical mechanical polishing. As a result, the dishing can be further reduced.

In the method for planarizing a deposited film, the first stage of the chemical mechanical polishing is preferably performed until a thickness of the deposited film remaining on the substrate becomes larger than zero and not larger than 200 nm.

Thus, the time required for the second stage of the chemical mechanical polishing can be shortened, so as to reduce the in-plane variation in the thickness of the deposited film caused during the second stage of the chemical mechanical polishing. As a result, the dishing can be further reduced.

In the method for planarizing a deposited film, in-plane variation in a thickness of the deposited film attained when the first stage of the chemical mechanical polishing is completed is preferably 5% or less.

Thus, the dishing can be further reduced.

In the method for planarizing a deposited film, surface unevenness remaining on the substrate when the first stage of the chemical mechanical polishing is completed is preferably larger than 0 and not larger than 20 nm.

Thus, the dishing can be further reduced.

The method for planarizing a deposited film of this invention preferably further comprises a step of performing conditioning of a polishing pad between the first stage of the chemical mechanical polishing and the second stage of the chemical mechanical polishing or at the beginning of the second stage of the chemical mechanical polishing.

Thus, the performance of a slurry used at the second stage of the chemical mechanical polishing to hold abrasive grains can be improved so as to improve in-plane uniformity in the polishing rate. As a result, the dishing can be further reduced.

In the method for planarizing a deposited film, the groove preferably has a width of 1 $\mu$m through 100 $\mu$m.

Thus, the effect of the method for planarizing a deposited film of this invention can be definitely exhibited.

Preferably in the method for planarizing a deposited film, the groove is an interconnect groove and the deposited film is a conducting film, and the step of removing a portion of the deposited film present outside the groove through the second stage of the chemical mechanical polishing includes a sub-step of forming a buried interconnect from the conducting film.

Thus, a buried interconnect with less dishing can be definitely formed.

In this case, the method for planarizing a deposited film preferably further comprises a step of forming a barrier metal layer between the interconnect groove and the conducting film, and it is preferred that the conducting film is a copper alloy film and that the barrier metal layer is a tantalum nitride film.

Preferably in the method for planarizing a deposited film, the groove is an isolation groove and the deposited film is an insulating film, and the step of removing a portion of the deposited film present outside the groove through the second stage of the chemical mechanical polishing includes a sub-step of forming an isolation region from the insulating film.

Thus, an isolation region with less dishing can be definitely formed.

In this case, the method for planarizing a deposited film preferably further comprises a step of forming an inversion preventing layer on a bottom of the isolation groove, and the insulating film is preferably a silicon dioxide film.

DETAILED DESCRIPTION OF THE INVENTION

Embodiment 1

A method for planarizing a deposited film according to Embodiment 1 of the invention will now be described with reference to FIGS. 1A through 1D and 2A through 2C.

Figure 1A:
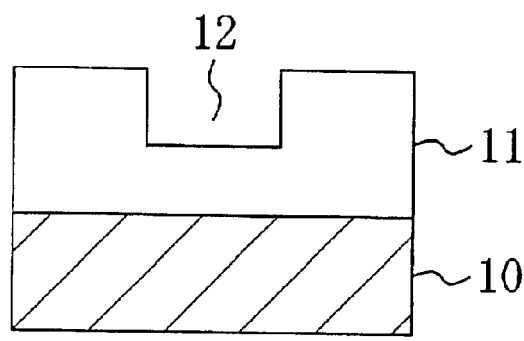
FIGS. 1A, 1B, 1C and 1D are cross-sectional views for showing procedures in a method for planarizing a deposited film according to Embodiment 1 of the invention.
Figure 1B:
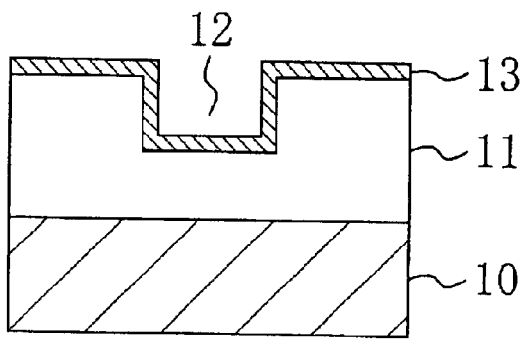

First, as shown in FIG. 1A, an interconnect groove 12 is formed by photolithography and dry etching in an interlayer insulating film 11 of silicon dioxide deposited on a semiconductor substrate 10. Thereafter, as shown in FIG. 1B, a barrier metal layer 13 of, for example, a tantalum nitride film is formed over the interlayer insulating film 11 including the inside faces of the interconnect groove 12.

Figure 1C:
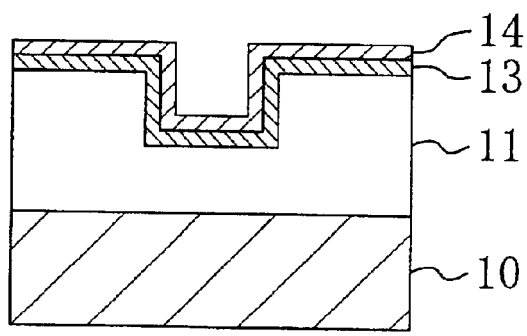
Figure 1D:
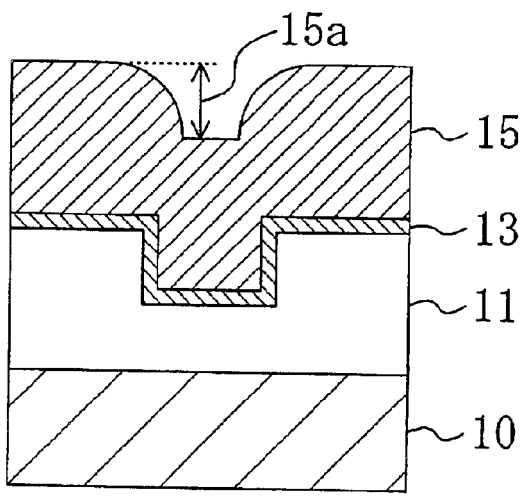

Next, as shown in FIG. 1C, a seed layer 14 of copper is formed by sputtering on the barrier metal layer 13. Thereafter, as shown in FIG. 1D, a copper film 15 is deposited by growing the seed layer 14 by electroplating. Thus, an initial level difference 15a is formed in the copper film 15 above the interconnect groove 12.

Figure 2A:
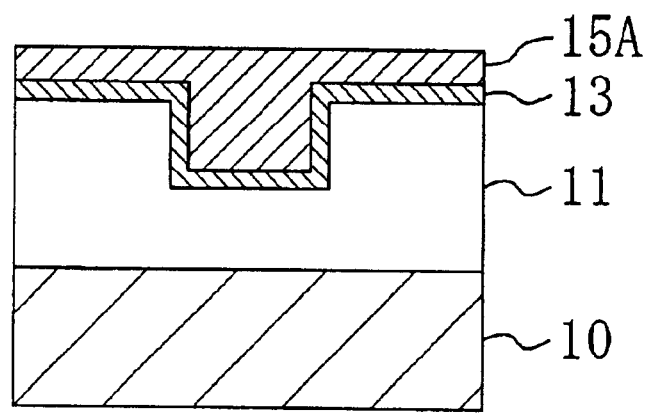
FIGS. 2A, 2B and 2C are cross-sectional views for showing other procedures in the method for planarizing a deposited film of Embodiment 1.

Then, the copper film 15 is subjected to a first stage of CMP, thereby obtaining a planarized copper film 15A with the initial level difference 15a eliminated as shown in FIG. 2A.

Figure 2B:
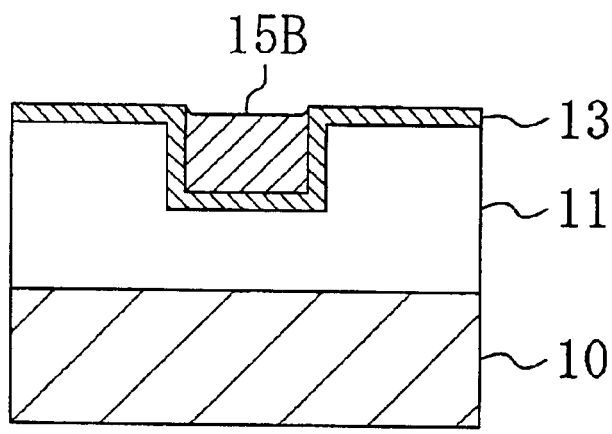

Subsequently, the planarized copper film 15A is subjected to a second stage of the CMP, thereby removing a portion of the planarized copper film 15A present outside the interconnect groove 12 as shown in FIG. 2B. Thus, a buried copper interconnect 15B is obtained.

Figure 2C:
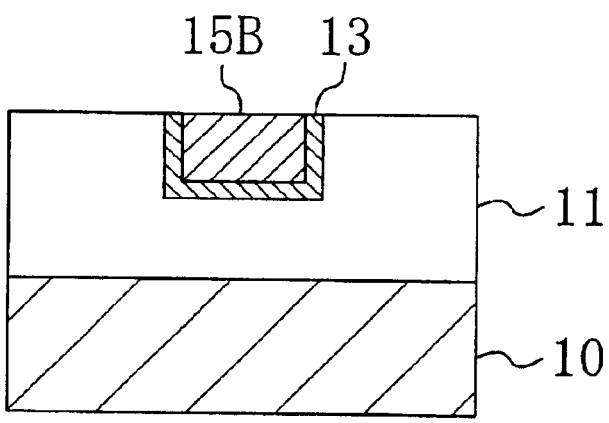

Finally, a portion of the barrier metal layer 13 present outside the interconnect groove 12 is removed as shown in FIG. 2C.

As characteristics of Embodiment 1, the thickness of the copper film 15 is set to 1.6 through 2.0 times as large as the depth of the interconnect groove 12; and the first stage of the CMP is carried out so that a portion of the planarized copper film 15A present on the barrier metal layer 13 can attain a thickness larger than 0 (zero) and not larger than 50% of the depth of the interconnect groove 12.

When the first stage of the CMP is carried out so that the portion of the planarized copper film 15A present on the barrier metal layer 13 can attain a thickness larger than 0 (zero) and not larger than 50% of the depth of the interconnect groove 12, the polishing time required for the second stage of the CMP can be shortened. Therefore, in-plane variation in the thickness of the copper film 15 can be prevented from increasing at the second stage of the CMP, so as to avoid increase of surface unevenness.

Figure 3:
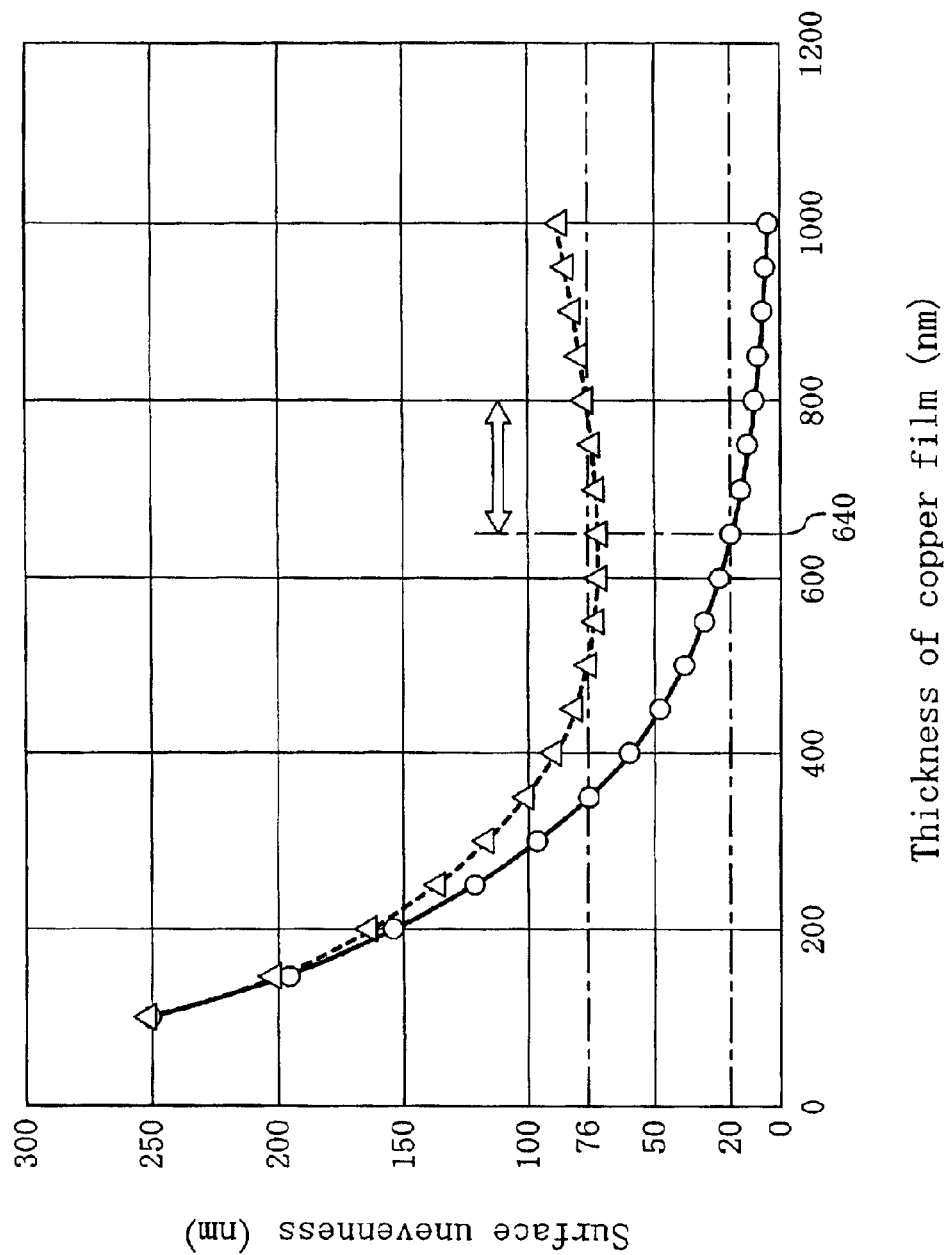
FIG. 3 is a diagram of simulation results for showing the relationship between the thickness of a copper film and surface unevenness obtained in CMP.

Now, the reason why the thickness of the copper film 15 is set to 1.6 through 2.0 times as large as the depth of the interconnect groove 12 will be described with reference to FIG. 3. In FIG. 3, a solid line plotted with 0 shows the relationship between the thickness of the copper film and the surface unevenness obtained when the first stage of the CMP is completed, and a broken line plotted with A shows the relationship between the thickness of the copper film and the surface unevenness obtained when the second stage of the CMP is completed. Also, the relationships shown in FIG. 3 are obtained when the interconnect groove 12 has a depth of 400 nm.

First, the thickness of the copper film 15 is preferably not less than 1.6 times as large as the depth of the interconnect groove 12 for the following reason:

When a level difference (surface unevenness) remaining after completing the first stage of the CMP, namely, the surface unevenness of the planarized copper film 15A, is smaller than 20 nm, the copper film 15 is regarded to be sufficiently planarized. This is because, as shown with the solid line in FIG. 3, the surface unevenness is exponentially reduced as the polishing proceeds during the first stage of the CMP but the reduction of the surface unevenness is saturated when the surface unevenness becomes 20 nm. In other words, it is not only useless but also causes lowering of throughput and increase of cost to reduce the surface unevenness to be smaller than 20 nm. A condition for reducing the surface unevenness to be smaller than 20 nm when the first stage of the CMP is completed is that the thickness of the copper film 15 is 640 nm or more, namely, the thickness of the copper film 15 is not less than 1.6 times as large as the depth of the interconnect groove 12.

The thickness of the copper film 15 is preferably below 2.0 times as large as the depth of the interconnect groove 12 for the following reason:

As the thickness of the copper film 15 is larger, the surface unevenness caused at the second stage of the CMP is larger. This is because when the thickness of the copper film 15 is larger, the polishing time required for the second stage of the CMP is longer, and hence, the in-plane variation in the thickness of the planarized copper film 15A is larger. Specifically, as shown with the broken line in FIG. 3, when the thickness of the copper film 15 exceeds 800 nm, namely, when the thickness of the copper film 15 is more than 2.0 times as large as the depth of the interconnect groove 12, the in-plane variation in the polishing rate at the second stage of the CMP is increased, so as to increase the surface unevenness.

Furthermore, when the thickness of the copper film 15 is more than 2.0 times as large as the depth of the interconnect groove 12, the throughput is lowered, the consumption of the slurry is increased and the cost is increased. In addition, the deposition of the copper film 15 with a large thickness is a burden also on the copper plating processing, which may lower the throughput and increase the cost.

Now, the base on which the thickness of the copper film 15 is set to 1.6 through 2.0 times as large as the depth of the interconnect groove 12 will be specifically described.

First, the CMP of the copper film will be analyzed dividedly between the first stage (planarizing stage) and the second stage (over-polishing stage). The first stage is a process where the deposited copper film (hereinafter referred to as the deposited film) is planarized while polishing, and during this stage, the surface unevenness is reduced in the course of polishing time. The second stage is a process where the copper film partially remaining on the substrate surface is completely removed after the first stage, and during this stage, the surface unevenness is increased in the course of polishing time.

Assuming that change with time of the surface unevenness during the first stage of the CMP is represented by $S_P(t)$ and that change with time of the surface unevenness during the second stage of the CMP is represented by $S_O(t)$, $S_P(t)$ and $S_O(t)$ respectively satisfy differential equations regarding time and initial and end conditions represented by the following Equations 1 and 2:

Equation 1:

(First stage of CMP): $\dfrac{dS_P(t)}{dt} + kh_P V \times S_P(t) = 0$

Initial condition: $\lim\limits_{t\to 0} S_P(t) = S_0$

Equation 2:

(Second stage of CMP): $\dfrac{dS_o(t)}{dt} + kh_o V \times S_o(t) = kVP_T$

Initial condition: $\lim\limits_{t\to 0} S_o(t) = S_1$   End condition: $\lim\limits_{t\to\infty} S_o(t) = S_2$ In Equations 1 and 2, $S_O$ is the height of an initial level difference formed in the deposited film; $S_1$ is the height of surface unevenness remaining after completing the first stage of the CMP; $S_2$ is the depth of the interconnect groove; t is the polishing time; V is a relative polishing rate; $P_T$ is a polishing pressure applied to a top portion of the surface unevenness; k is a Preston constant corresponding to a proportionality factor obtained in assuming that a polishing rate is in proportion to a product of the relative polishing rate and the polishing pressure; and $h_P$ and $h_O$ are proportionality factors obtained in assuming that the surface unevenness is in proportion to a pressure difference at the first and second stages of the CMP.

The reason why the relationships represented by Equations 1 and 2 can be introduced will now be described.

<First Stage (Planarizing Stage) of CMP>

Assuming that the height of the initial level difference formed in the deposited film is $S_O$ and that the polishing amounts of a top portion and a bottom portion of the surface unevenness of the deposited film obtained after time t are $R_T(t)$ and $R_B(t)$, surface unevenness $S_P(t)$ caused in the process for planarizing the deposited film through the first stage of the CMP is represented as follows:

$$S_P(t)=S_0-R_T(t)+R_B(t) \tag{1}$$

When the both members of the expression (1) are differentiated by the time t, the following expression is obtained:

$$dS_P(t)/dt=-R_T(t)/dt+dR_B(t)/dt \tag{2}$$

On the basis of Preston equation, the polishing rate of the top portion and the polishing rate of the bottom portion are respectively represented by the following expressions (3) and (4):

$$dR_T(t)/dt=k_T P_T(t) V_T(t) \tag{3}$$

$$dR_B(t)/dt=k_B P_B(t) V_B(t) \tag{4}$$

wherein $k_T$ and $k_B$ are Preston constants of the top portion and the bottom portion, respectively; $P_T(t)$ and $P_B(t)$ are polishing pressures applied to the top portion and the bottom portion, respectively; and $V_T(t)$ and $V_B(t)$ are relative polishing rates on the top portion and the bottom portion, respectively.

When the expressions (3) and (4) are substituted in the right member of the expression (2), the following expression (5) is obtained:

$$dS_P(t)/dt=-k_T P_T(t)V_T(t)+k_B P_B(t)V_B(t) \tag{5}$$

At this point, the two Preston constants, $k_T$ and $k_B$, are assumed to be the same constant k because a Preston constant depends upon the slurry and the quality of a film to be polished, and therefore, the constant $k_T$ of the top portion and the constant $k_B$ of the bottom portion can be regarded as the same. Accordingly, $$k_T=k_B k \tag{6}$$

Furthermore, the two relative polishing rates, $V_T(t)$ and $V_B(t)$, are assumed to be the same constant V because the relative polishing rate can be regarded as substantially equal on the top portion and the bottom portion adjacent to each other with one unevenness sandwiched therebetween. At this point, the polishing rates $V_T(t)$ and $V_B(t)$ are assumed to be the constant V for the purpose of simplifying calculation. Accordingly, $$V_T(t)=V_B(t)V \tag{7}$$

Then, the expressions (6) and (7) are substituted in the right member of the expression (5) and the resultant is rearranged to give the following expression:

$$dS_P(t)/dt=-k_V \times \{P_T(t)-P_B(t)\} \tag{8}$$

At this point, it is assumed that a pressure difference between the top portion and the bottom portion of the unevenness, namely, $P_T(t)-P_B(t)$ $\ddot{A}P(t)$, is in proportion to the surface unevenness $S_P(t)$ with a proportionality factor of $h_P$. Specifically, as the proportionality factor $h_P$ is larger, the surface is planer. Accordingly, the following expression (9) can be assumed to hold:

$$P_T(t)-P_B(t)\,\ddot{A}P(t)=h_P \times S_P(t) \tag{9}$$

When the expression (9) is substituted in the right member of the expression (8) and the resultant is rearranged, the following expression (10) is obtained:

$$dS_P(t)/dt+kh_P V \times S_P(t)=0 \tag{10}$$

The expression (10) is a first stage linear differential equation of the surface unevenness $S_P(t)$, that is, a function of the time t.

When the expression (10) is solved, the following expression (11) is obtained:

$$S_P(t)=N_P \times \exp(-kh_P V \times t)=0 \tag{11}$$

wherein $N_P$ is an arbitrary constant.

When the arbitrary constant $N_P$ is obtained by applying the initial condition, $S_P(t)=S_0$ (the initial level difference) when t=0, to the expression (11), the following expression holds:

$$N_P=S_0 \tag{12}$$

When the expression (12) is substituted in the expression (11), the following expression (13) is obtained as an expression representing the surface unevenness $S_P(t)$ caused at the first stage of the CMP to be performed:

$$S_P(t)=S_0 \times \exp(-kh_P V \times t) \tag{13}$$

<Second Stage (Over-Polishing Stage) of CMP>

In the same manner as in the first stage of the CMP, the surface unevenness $S_O(t)$ caused at the second stage of the CMP is considered on the basis of the expression (1). Since TaN (namely, the barrier metal layer) or $SiO_2$ (namely, the interlayer insulating film) is exposed on the surface portion other than the interconnect part at the second stage of the CMP, the polishing amount of the top portion can be approximated as $R_T(0)=0$. In other words, the expression (1) can be regarded as the following expression (14):

$$S_O(t)=S_1+R_B(t) \tag{14}$$

wherein $S_1$ is the surface unevenness remaining when the first stage of the CMP is completed.

When the both members of the expression (14) are differentiated by the time t, the following expression (15) is obtained:

$$dS_O(t)/dt = dR_B(t)/dt \quad (15)$$

As in the first stage of the CMP, the expressions (4), (6) and (7) are applied to the expression (15) to give the following expression (16):

$$dS_O(t)/dt = kV \times P_B(t) \quad (16)$$

In the same manner as in the first stage of the CMP, the following expression (17) is assumed:

$$P_T(t) - P_B(t) = h_0 \times S_O(t) \quad (17)$$

wherein $h_0$ is a proportionality factor employed at the second stage of the CMP.

Since TaN (namely, the barrier metal layer) or $SiO_2$ (namely, the interlayer insulating film) is exposed on the surface portion other than the interconnect part at the second stage of the CMP, the polishing pressure $P_T(t)$ applied to the top portion can be regarded as a constant value, $P_T$. Accordingly, the expression (17) can be regarded as the following expression (18):

$$P_B(t) = P_T - h_0 \times S_O(t) \quad (18)$$

When the expression (18) is substituted in the expression (16) and the resultant is rearranged, the following expression (19) is obtained:

$$dS_O(t)/dt + kh_0 V \times S_O(t) = kVP_T \quad (19)$$

The expression (19) is a first stage linear differential equation of the surface unevenness $S_O(t)$, that is, a function of the time t. When the expression (19) is solved, the following expression (20) is obtained:

$$S_O(t) = N_0 \times f(-kh_P V \times t) + P_T/h_0 \quad (20)$$

wherein $N_0$ is an arbitrary constant.

When the arbitrary constant $N_0$ is obtained by applying the initial condition, that is, $S_O(t) = S_1$ when t=0 (namely, the remaining unevenness obtained in completing the first stage), the following expression (21) is obtained:

$$N_0 = S_1 - P_T/h_0 \quad (21)$$

When the expression (21) is substituted in the expression (20), the following expression (22) is obtained as an expression representing the surface unevenness $S_O(t)$ caused at the second stage of the CMP to be performed:

$$S_O(t) = S_1 \times \exp(-kh_0 V \times t) + (P_T/h_0) \times \{1 - \exp(-kh_0 V \times t)\} \quad (22)$$

When a sufficient time t has elapsed, the following expression (23) holds:

$$\lim_{t \to \infty} S_O(t) = S_2 \quad (23)$$

wherein $S_2$ is the depth of the interconnect groove. Therefore, the expression (23) means that the interconnect is eliminated at the second stage of the CMP.

When the expression (23) is applied to the expression (22), the following expression (24) is obtained:

$$S_2 = P_T/h_0 \quad (24)$$

When the expression (24) is substituted in the expression (22), the surface unevenness $S_O(t)$ caused at the second stage of the CMP is represented by the following expression (25):

$$S_O(t) = S_1 \times \exp(-kh_0 V \times t) + S_2 \times \{1 - \exp(-kh_0 V \times t)\} \quad (25)$$

In this manner, on the basis of the expression (13), the surface unevenness $S_P(t)$ caused at the first stage of the CMP is represented as follows:

$$S_P(t) = S_0 \times \exp(-kh_P V \times t)$$

Also, on the basis of the expression (25), the surface unevenness $S_O(t)$ obtained at the second stage of the CMP is represented as follows:

$$S_O(t) = S_1 \times \exp(-kh_0 V \times t) + S_2 \times \{1 - \exp(-kh_0 V \times t)\}$$

On the basis of the aforementioned theory, the optimal thickness of the copper film with respect to the initial level difference can be determined.

Figure 4:
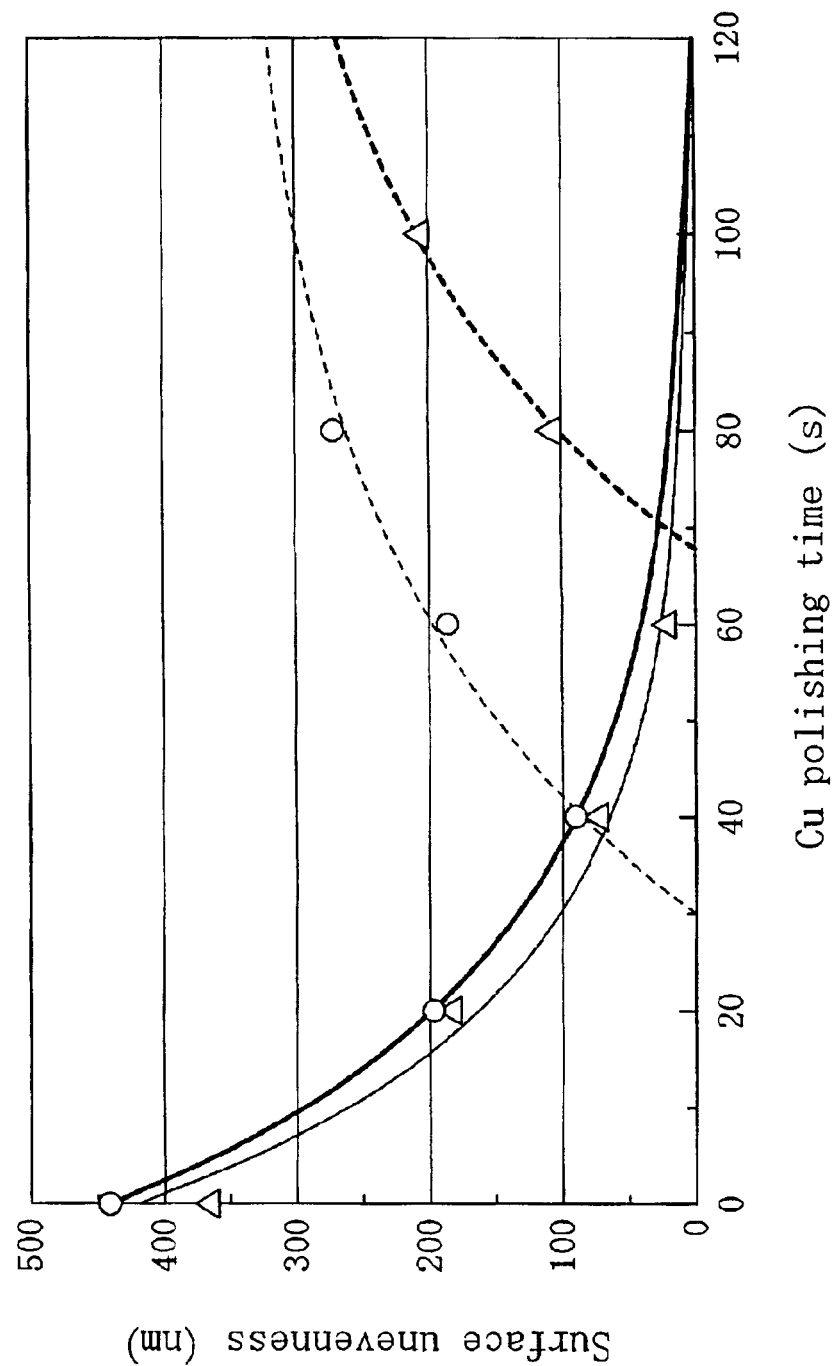
FIG. 4 is a diagram of experiment results for showing the relationship between the polishing time for a copper film and the surface unevenness obtained in the CMP.

FIG. 4 shows experiment values of the surface unevenness changing with the time for polishing copper. In FIG. 4, the abscissa indicates the surface unevenness and the ordinate indicates the time for polishing copper. With respect to the thickness of the copper film, that is, a parameter, a line plotted with ○ denotes a thickness of 550 nm and a line plotted with Δ denotes a thickness of 850 nm, and a solid line denotes an approximate curve obtained at the first stage of the CMP and a broken line denotes an approximate curve obtained at the second stage of the CMP.

As described above, the surface unevenness is reduced in accordance with the increase of the polishing time during the first stage of the CMP while it is increased in accordance with the increase of the polishing time during the second stage of the CMP.

Also, in the case where the copper film has a thickness of 550 nm, namely, in the case where the thickness of the copper film is approximately 1.4 times as large as the depth of the interconnect groove, the minimum value of the surface unevenness is approximately 100 nm, which means that the surface is not sufficiently planarized. Alternatively, in the case where the copper film has a thickness of 850 nm, namely, in the case where the thickness of the copper film is approximately 1.9 times as large as the depth of the interconnect groove, the minimum value of the surface unevenness is approximately 30 nm, which means that the surface is sufficiently planarized. Moreover, it is understood from this graph that the aforementioned expressions, namely, the expressions (13) and (25), accurately fit with the experiment results.

Figure 5:
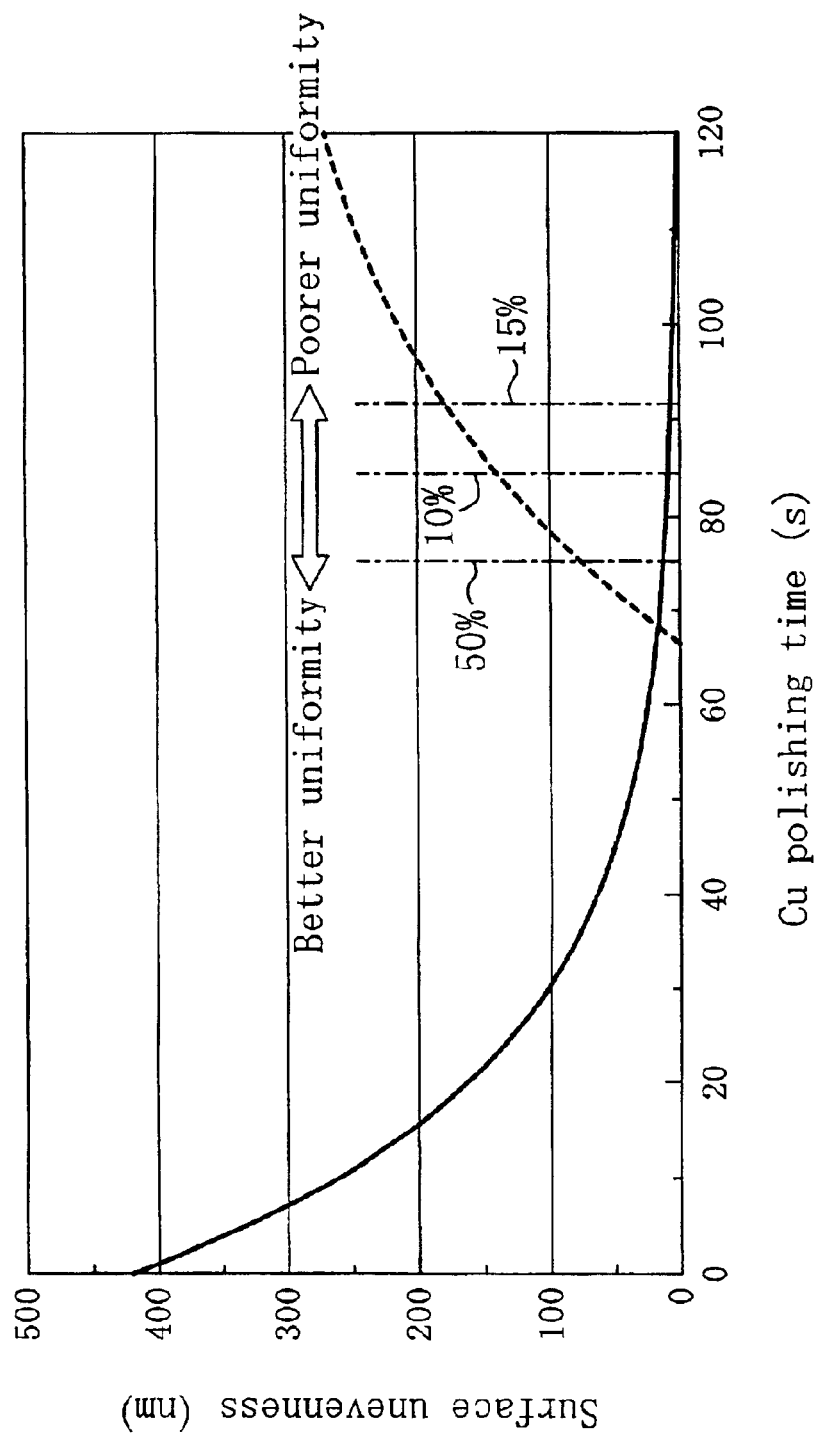
FIG. 5 is a diagram of simulation results for showing the relationship between the polishing time for a copper film and the surface unevenness obtained in the CMP.

FIG. 5 shows simulation results obtained between the surface unevenness and the polishing time in the case where the CMP is carried out on a pattern including the buried interconnect 15B with a line width of 20 μm and the initial level difference of 400 nm. In this case, the copper film has a thickness of 750 nm, which is approximately 1.9 times as large as the depth of the interconnect groove (namely, the initial level difference). In FIG. 5, the abscissa indicates the surface unevenness and the ordinate indicates the time for polishing copper, and a solid line denotes the simulation results obtained at the first stage of the CMP and a broken line denotes the simulation results obtained at the second stage of the CMP. Since the polishing rate of copper is approximately 600 nm/min., 10 seconds of the polishing time corresponds to a polishing amount of 100 nm.

First, the first stage of the CMP will be described. During the first stage, the initial level difference of 400 nm is reduced to the surface unevenness of 20 nm or less through the polishing of 60 seconds, which means that the surface is substantially planarized. If the copper film has an unnecessarily large thickness, although the large thickness is suitable to sufficient planarization, the copper film partly remains on the substrate in a large thickness. Therefore, while the remaining copper film is being completely removed, the in-plane variation in the surface unevenness is increased, and hence, excessive over-polishing should be performed at the second stage, which increases the dishing. Accordingly, the thickness of the copper film partly remaining on the substrate in completing the first stage of the CMP is preferably as small as possible. In FIG. 5, the thickness of the remaining copper film is 200 nm or less.

Next, the second stage of the CMP will be described. The second stage is a process where the over-polishing is performed for completely removing the thin copper film remaining when the first stage is completed.

In FIG. 5, with the in-plane variation in the thickness of the planarized copper film 15A obtained in completing the first stage of the CMP changed to three levels (specifically, 5%, 10% and 15%), necessary amounts of over-polishing are estimated. In this case, the thin copper film remaining on the substrate has a thickness of 200 nm or less.

It is understood from FIG. 5 that when the in-plane variation in the thickness of the planarized copper film 15A is 5% or less, the dishing formed in completing the second stage of the CMP can be suppressed to 100 nm or less. When the in-plane variation is 5% or less, unevenness corresponding to the thickness of the barrier metal layer 13 of, for example, 35 nm can be relaxed at the second stage of the CMP, and therefore, unevenness of 50 nm or less can be attained in completing the second stage of the CMP.

As described above, as the in-plane variation in the thickness of the planarized copper film 15A is larger, more excessive over-polishing is necessary, and hence, the dishing is accordingly increased.

Accordingly, in order to suppress the increase of the dishing, not only the thickness of the copper film is set to approximately 1.9 times as large as the depth of the interconnect groove (namely, the initial level difference) so as to make the thickness of the portion of the copper film remaining in completing the first stage of the CMP as small as possible without exposing the interconnect pattern, but also the copper film is polished at the first stage of the CMP to attain in-plane uniformity in the thickness of the planarized copper film. Thus, the dishing can be largely reduced.

Although the CMP is once stopped when the first stage of the CMP of the copper film 15 is completed before starting the second stage of the CMP in Embodiment 1, the first stage and the second stage of the CMP may be continuously performed.

Although the copper film 15 is formed by the electroplating on the seed layer 14 in Embodiment 1, the copper film 15 may be formed by another method.

Although the buried interconnect 15B is formed in Embodiment 1, the method for planarizing a deposited film of this invention is applicable to a method for forming a via for connecting a lower interconnect to an upper interconnect.

In Embodiment 1, the interconnect groove 12 preferably has a width of approximately 1 through 100 $\mu$m. This is for the following reason: When the interconnect groove 12 has a width smaller than 1 $\mu$m, the width is so small that the initial level difference is not formed on the surface of the deposited copper film 15 and hence the surface of the copper film 15 is substantially plane. On the other hand, when the interconnect groove 12 has a width larger than 100 $\mu$m, the copper film 15 is difficult to planarize by the CMP because the polishing pad follows the level difference.

Embodiment 2

A method for planarizing a deposited film according to Embodiment 2 of the invention will now be described with reference to FIGS. 6A through 6D and 7A through 7C.

Figure 6A:
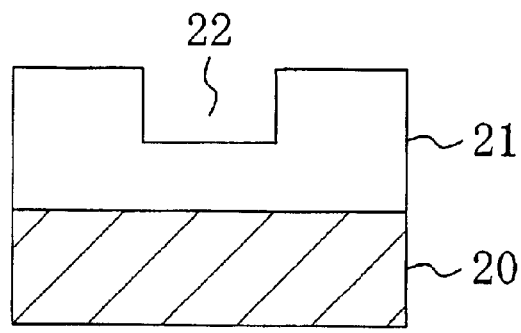
FIGS. 6A, 6B, 6C and 6D are cross-sectional views for showing procedures in a method for planarizing a deposited film according to Embodiment 2 of the invention.
Figure 6B:
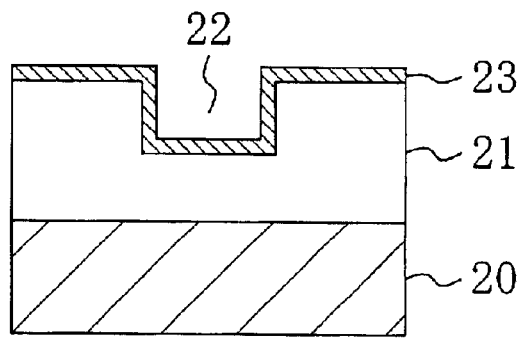

First, as shown in FIG. 6A, an interconnect groove 22 is formed by the photolithography and the dry etching in an interlayer insulating film 21 of silicon dioxide deposited on a semiconductor substrate 20. Thereafter, as shown in FIG. 6B, a barrier metal layer 23 of, for example, a tantalum nitride film is formed over the interlayer insulating film 21 including the inside faces of the interconnect groove 22.

Figure 6C:
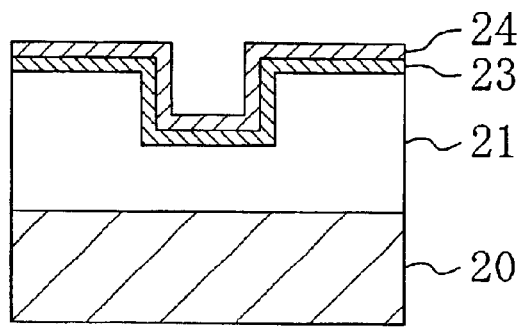
Figure 6D:
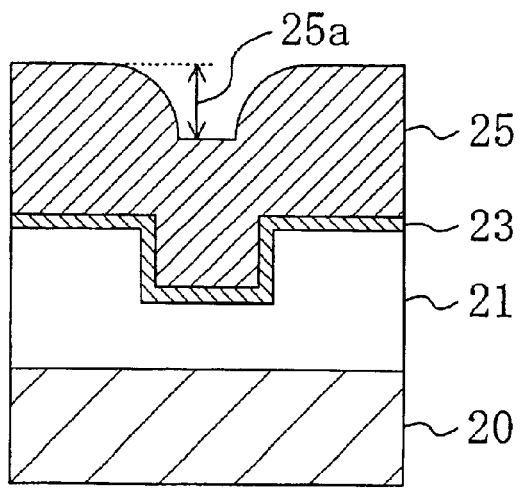

Next, as shown in FIG. 6C, a seed layer 24 of copper is formed by the sputtering on the barrier metal layer 23. Thereafter, as shown in FIG. 6D, a copper film 25 is deposited by growing the seed layer 24 by the electroplating. Thus, an initial level difference 25a is formed in the copper film 25 above the interconnect groove 22.

Figure 7A:
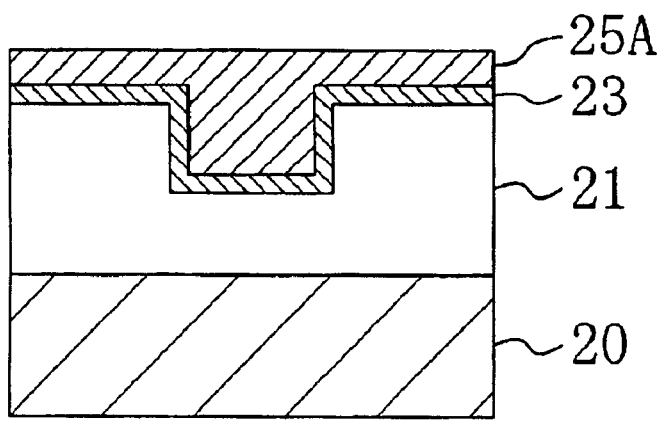
FIGS. 7A, 7B and 7C are cross-sectional views for showing other procedures in the method for planarizing a deposited film of Embodiment 2.

Then, the copper film 25 is subjected to a first stage of the CMP under conditions of a relatively high rotation speed and a relatively low pressure, so as to eliminate the initial level difference 25a. Thus, a planarized copper film 25A is obtained as shown in FIG. 7A.

When the first stage of the CMP is thus performed with a high rotation speed and a low pressure, the polishing rate on a top portion of the unevenness is higher and the polishing rate on a bottom portion is lower as compared with the case where the CMP is performed under general conditions. Therefore, the copper film 25 can be planarized in a shorter polishing time. As a result, when the first stage of the CMP is completed, the planarized copper film 25A can attain a higher level of planarization.

The CMP performed under the conditions of a high rotation speed and a low pressure is advantageous for the planarization of unevenness but is disadvantageous for the in-plane uniformity in the film thickness because the polishing rate is unstable.

Figure 7B:
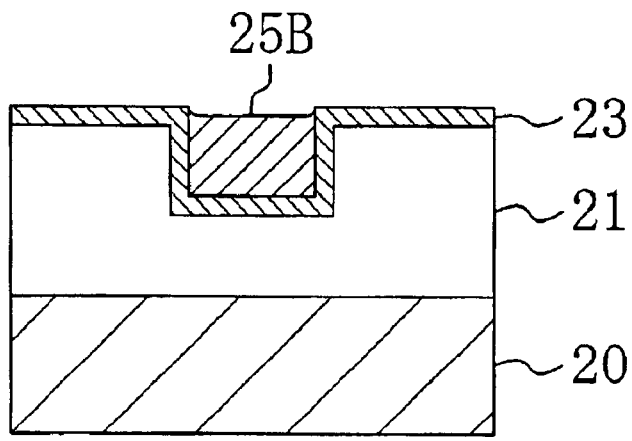

Therefore, the planarized copper film 25A is subjected to a second stage of the CMP under conditions of a relatively low rotation speed and a relatively high pressure. Thus, as shown in FIG. 7B, a portion of the planarized copper film 25A present outside the interconnect groove 22 is removed so as to form a buried copper interconnect 25B.

When the second stage of the CMP is thus performed with a low rotation speed and a high pressure, the in-plane uniformity in the film thickness can be improved as compared with that attained by the CMP performed with the same polishing rate under the general conditions. Therefore, the portion of the planarized copper film 25A present outside the interconnect groove 22 can be removed in a shorter time. Accordingly, the second stage of the CMP can be completed in a shorter time, and hence, the increase of the dishing caused during the second stage of the CMP can be suppressed.

Figure 7C:
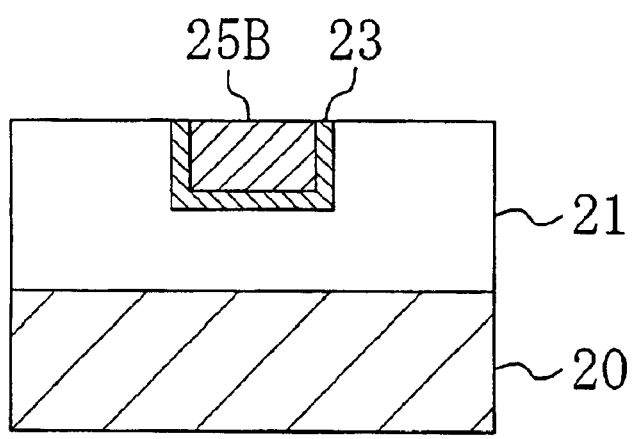

Finally, as shown in FIG. 7C, a portion of the barrier metal layer 23 present outside the interconnect groove 22 is removed.

According to Embodiment 2, the first stage of the CMP is performed with a relatively high rotation speed and a relatively low pressure so as to obtain the planarized copper film 25A, and thereafter, the second stage of the CMP is performed with a relatively low rotation speed and a relatively high pressure so as to remove the portion of the planarized copper film 25A present outside the interconnect groove 22. Therefore, the dishing caused on the surface of the buried copper interconnect 25B can be reduced.

Also in Embodiment 2, the first stage of the CMP is preferably performed so that a portion of the planarized copper film 25A present on the barrier metal layer 23 can attain a thickness larger than 0 (zero) and not larger than 50% of the depth of the interconnect groove 22. Thus, the polishing time required for the second stage of the CMP can be shortened, and hence, the surface unevenness can be prevented from increasing due to increase of the in-plane variation in the polishing rate during the second stage of the CMP.

Embodiment 3

A method for planarizing a deposited film according to Embodiment 3 of the invention will now be described with reference to FIGS. 8A through 8D and 9A through 9C.

Figure 8A:
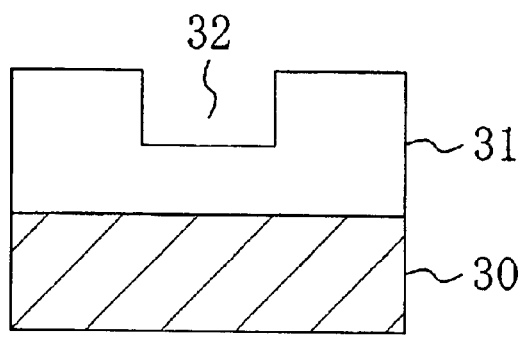
FIGS. 8A, 8B, 8C and 8D are cross-sectional views for showing procedures in a method for planarizing a deposited film according to Embodiment 3 of the invention.
Figure 8B:
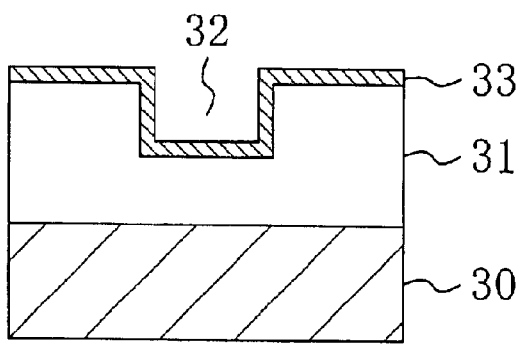

First, as shown in FIG. 8A, an interconnect groove 32 is formed by the photolithography and the dry etching in an interlayer insulating film 31 of silicon dioxide deposited on a semiconductor substrate 30. Thereafter, as shown in FIG. 8B, a barrier metal layer 33 of, for example, a tantalum nitride film is formed over the interlayer insulating film 31 including the inside faces of the interconnect groove 32.

Figure 8C:
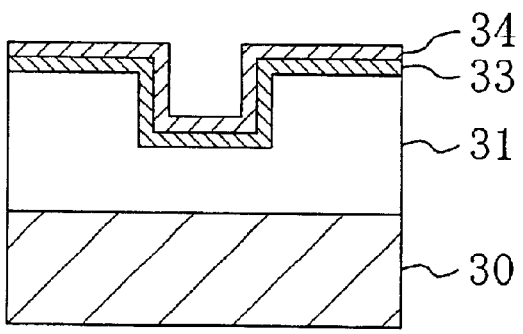
Figure 8D:
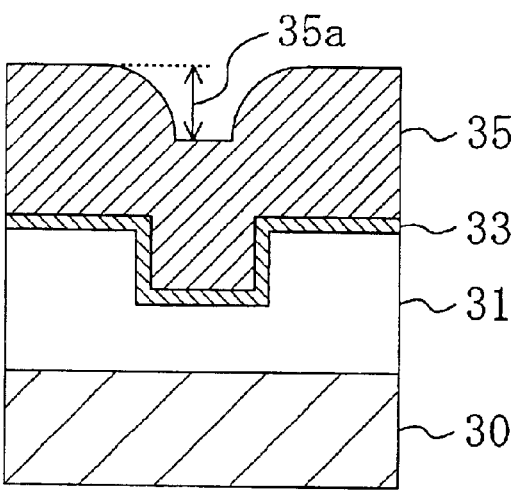

Next, as shown in FIG. 8C, a seed layer 34 of copper is formed by the sputtering on the barrier metal layer 33. Thereafter, as shown in FIG. 8D, a copper film 35 is deposited by growing the seed layer 34 by the electroplating. Thus, an initial level difference 35a is formed in the copper film 35 above the interconnect groove 32.

Figure 9A:
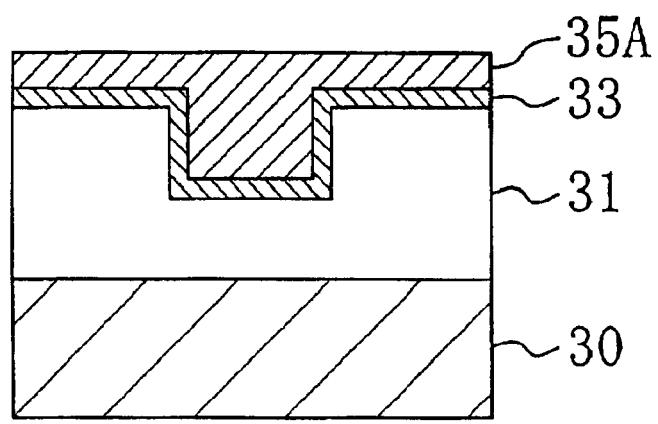
FIGS. 9A, 9B and 9C are cross-sectional views for showing other procedures in the method for planarizing a deposited film of Embodiment 3.

Then, a first stage of the CMP is performed so as to eliminate the initial level difference 35a. Thus, a planarized copper film 35A is obtained as shown in FIG. 9A.

Figure 9B:
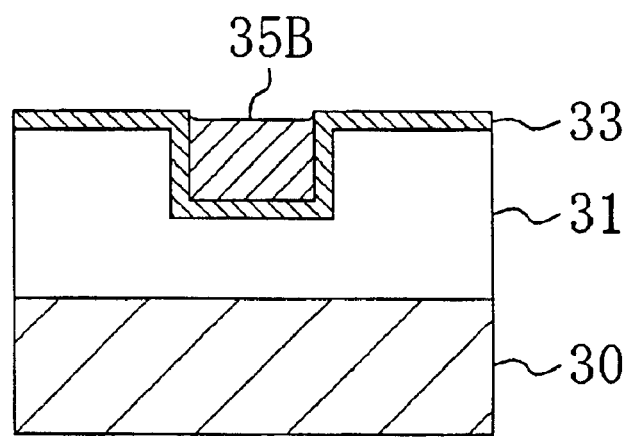

Subsequently, after raising the surface of the polishing pad by conditioning, the planarized copper film 35A is subjected to a second stage of the CMP. Thus, a portion of the planarized copper film 35A present outside the interconnect groove 32 is removed so as to form a buried copper interconnect 35B as shown in FIG. 9B.

Figure 9C:
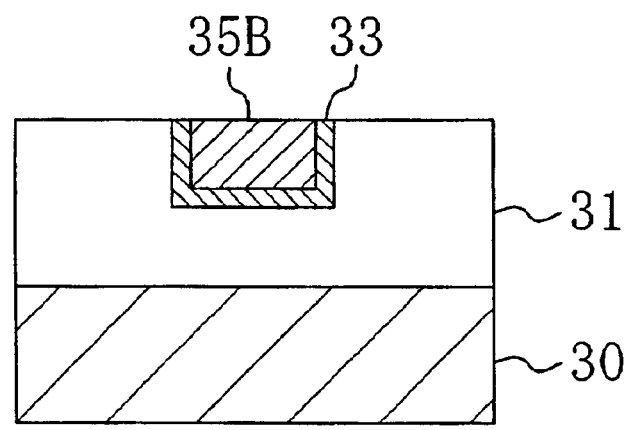

Finally, as shown in FIG. 9C, a portion of the barrier metal layer 33 present outside the interconnect groove 32 is removed.

The conditioning of the polishing pad is a process for roughening the surface of the polishing pad with diamond before starting the CMP. Since the surface of the polishing pad is raised by this conditioning, the performance of the slurry to hold abrasive grains can be improved so as to attain a higher polishing rate. As a result, higher in-plane uniformity can be attained. When the conditioning of the polishing pad is excessively carried out, however, the polishing pad is largely abraded, resulting in shortening the life of the polishing pad.

Therefore, in the conventional technique, the conditioning of the polishing pad is carried out before starting the CMP.

When the conditioning is performed before starting the CMP, however, the raised state of the surface of the polishing pad is reduced as the CMP is proceeded. Therefore, when the first stage of the CMP is completed, the surface of the polishing pad becomes plane and the performance to hold abrasive grains is lowered, and hence, the in-plane uniformity in the polishing rate is lowered at the second stage of the CMP.

In contrast, when the conditioning of the polishing pad is performed between the first stage and the second stage of the CMP as in Embodiment 3, the performance of the slurry to hold the abrasive grains is improved at the second stage of the CMP so as to improve the in-plane uniformity in the polishing rate. As a result, the dishing caused on the surface of the buried interconnect 35B can be reduced.

In Embodiment 3, the CMP is once stopped between the first stage and the second stage of the CMP for performing the conditioning. Instead, the conditioning may be performed substantially simultaneously with the start of the second stage of the CMP while carrying out the second stage of the CMP.

Also, Embodiment 3 is applicable to both the cases where the polishing is carried out under the same conditions at the first stage and the second stage of the CMP as in Embodiment 1 and where the polishing is carried out under the different conditions at the first stage and the second stage of the CMP as in Embodiment 2.

Embodiment 4

A method for planarizing a deposited film according to Embodiment 4 of the invention will now be described with reference to FIGS. 10A through 10D.

Figure 10A:
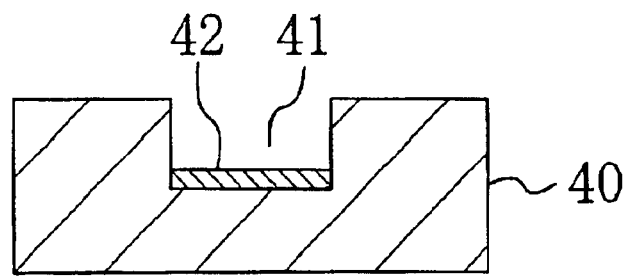
FIGS. 10A, 10B, 10C and 10D are cross-sectional views for showing procedures in a method for planarizing a deposited film according to Embodiment 4 of the invention.

First, as shown in FIG. 10A, after forming an isolation groove 41 in a surface portion of a semiconductor substrate 40, an inversion preventing layer 42 is formed on the bottom of the isolation groove 41.

Figure 10B:
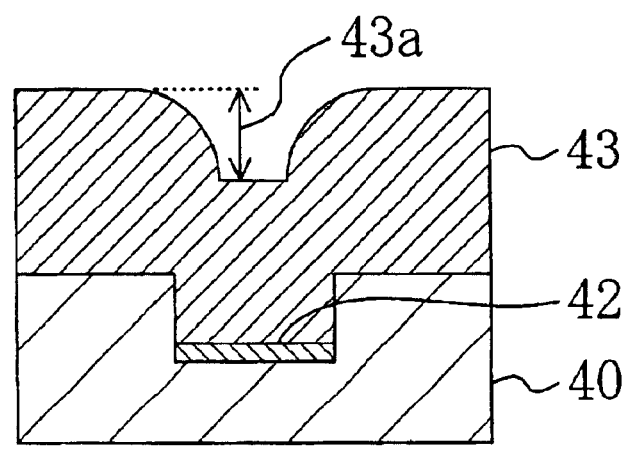

Next, as shown in FIG. 10B, an insulating film 43 of silicon dioxide is formed over the semiconductor substrate 40 including the inside faces of the isolation groove 41 in a thickness 1.6 through 2.0 times as large as the depth of the isolation groove 41. Thus, an initial level difference 43a is formed in the insulating film 43 above the isolation groove 41.

Figure 10C:
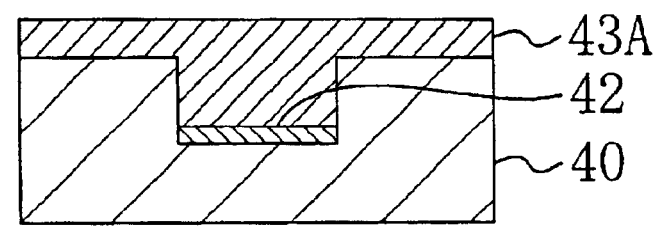

Then, the insulating film 43 is subjected to a first stage of the CMP so as to eliminate the initial level difference 43a. Thus, a planarized insulating film 43A is obtained as shown in FIG. 10C.

Figure 10D:
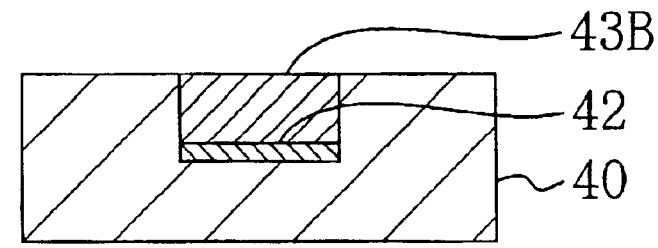
Figure 11A:
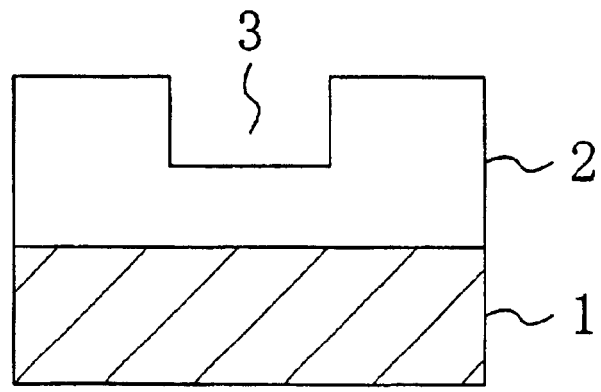
FIGS. 11A, 11B and 11C are cross-sectional views for showing procedures in a conventional method for planarizing a deposited film.
Figure 11B:
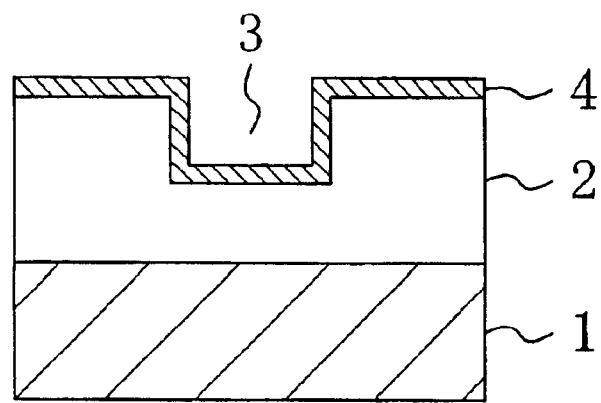
Figure 11C:
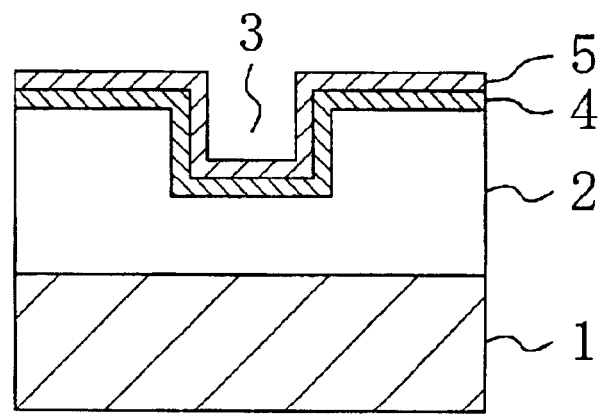
Figure 12A:
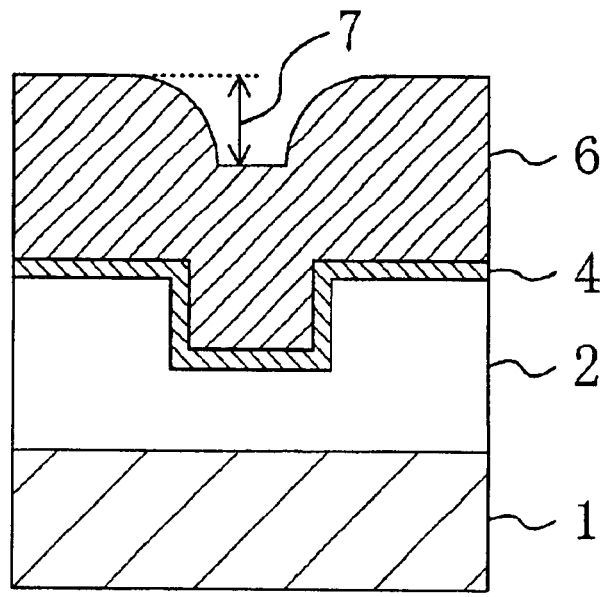
FIGS. 12A, 12B and 12C are cross-sectional views for showing other procedures in the conventional method for planarizing a deposited film.
Figure 12B:
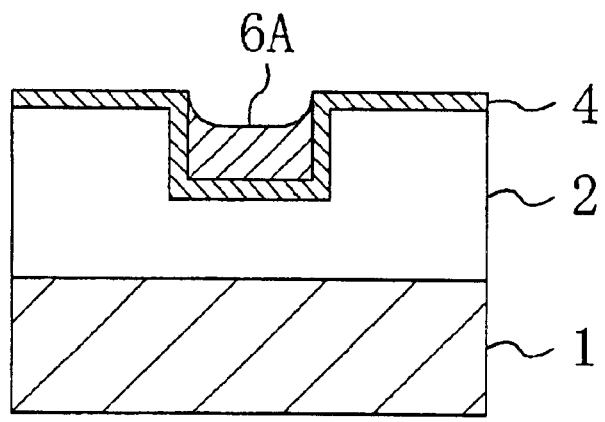
Figure 12C:
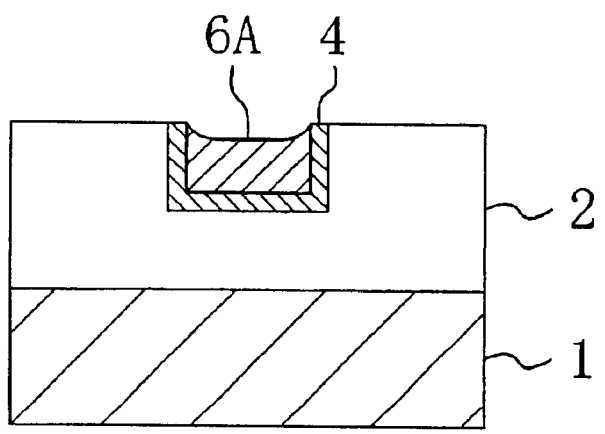
Figure 13A:
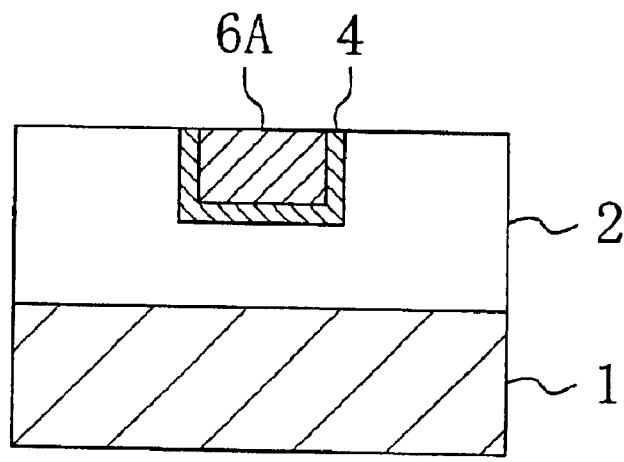
FIG. 13A is an ideal cross-sectional view of a buried interconnect and FIG. 13B is an actual cross-sectional view of a buried interconnect.
Figure 13B:
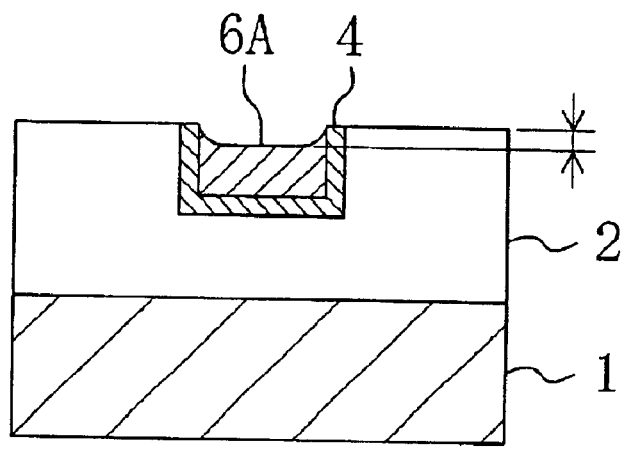

Subsequently, the planarized insulating film 43A is subjected to a second stage of the CMP, so as to remove a portion of the planarized insulating film 43A present outside the isolation groove 41. Thus, an isolation region 43B is formed as shown in FIG. 10D.

According to Embodiment 4, since the thickness of the insulating film 43 is set to 1.6 through 2.0 times as large as the depth of the isolation groove 41 as in Embodiment 1, the dishing can be reduced.

The thickness of the insulating film 43 is set to 1.6 through 2.0 times as large as the depth of the isolation groove 41 in Embodiment 4. Instead, the insulating film 43 may be subjected to the first stage of the CMP performed under conditions of a relatively high rotation speed and a relatively low pressure before the second stage of the CMP performed under conditions of a relatively low rotation speed and a relatively high pressure; or the conditioning of the polishing pad may be performed before or at the beginning of the second stage of the CMP.

What is claimed is:

1. A method for planarizing a deposited film comprising the steps of:

forming a groove in a surface portion of a substrate;
    forming a deposited film on said substrate so as to fill said groove;
    eliminating an initial level difference formed in said deposited film due to said groove by subjecting said deposited film to a first stage of chemical mechanical polishing with a relatively high rotation speed and a relatively low pressure; and
    removing a portion of said deposited film present outside said groove after eliminating said initial level difference by subjecting said deposited film to a second stage of the chemical mechanical polishing with a relatively low rotation speed and a relatively high pressure.

2. The method for planarizing a deposited film of claim 1, wherein said deposited film has a thickness 1.6 through 2.0 times as large as a depth of said groove.

3. The method for planarizing a deposited film of claim 1, wherein said first stage of the chemical mechanical polishing is performed until a thickness of said deposited film remaining on said substrate becomes larger than zero and not larger than 50% of a depth of said groove.

4. The method for planarizing a deposited film of claim 1, wherein said first stage of the chemical mechanical polishing is performed until a thickness of said deposited film remaining on said substrate becomes larger than zero and not larger than 200 nm.

5. The method for planarizing a deposited film of claim 1, wherein in-plane variation in a thickness of said deposited film attained when said first stage of the chemical mechanical polishing is completed is 5% or less.

6. The method for planarizing a deposited film of claim 1, wherein surface unevenness remaining on said substrate when said first stage of the chemical mechanical polishing is completed is larger than 0 and not larger than 20 nm.

7. The method for planarizing a deposited film of claim 1, further comprising a step of performing conditioning of a polishing pad between said first stage of the chemical mechanical polishing and said second stage of the chemical mechanical polishing or at the beginning of said second stage of the chemical mechanical polishing.

8. The method for planarizing a deposited film of claim 1, wherein said groove has a width of 1 μm through 100 μm.

9. The method for planarizing a deposited film of claim 1, wherein said groove is an interconnect groove and said deposited film is a conducting film, and the step of removing a portion of said deposited film present outside said groove through said second stage of the chemical mechanical polishing includes a sub-step of forming a buried interconnect from said conducting film.

10. The method for planarizing a deposited film of claim 9, further comprising a step of forming a barrier metal layer between said interconnect groove and said conducting film, wherein said conducting film is a copper alloy film, and said barrier metal layer is a tantalum nitride film.

11. The method for planarizing a deposited film of claim 1, wherein said deposited film has a top portion and a bottom portion, and said first stage of chemical mechanical polishing is performed under a condition in which a polishing rate on the top portion is higher than a polishing rate on the bottom portion.

12. The method for planarizing a deposited film of claim 1, wherein said deposited film has a top portion and a bottom portion, and said second stage of chemical mechanical polishing is performed under a condition in which a polishing rate on the top portion is equal to a polishing rate on the bottom portion.

13. A method for planarizing a deposited film comprising the steps of:

forming a groove in a surface portion of a substrate;

forming a deposited film on said substrate so as to fill said groove;

eliminating an initial level difference formed in said deposited film due to said groove by subjecting said deposited film to a first stage of chemical mechanical polishing with a relatively high rotation speed and a relatively low pressure: and removing a portion of said deposited film present outside said groove after eliminating said initial level difference by subjecting said deposited film to a second stage of the chemical mechanical polishing with a relatively low rotation speed and a relatively high pressure, wherein said groove is an isolation groove and said deposited film is an insulating film, and the step of removing a portion of said deposited film present outside said groove through said second stage of the chemical mechanical polishing includes a sub-step of forming an isolation region from said insulating film.

14. The method for planarizing a deposited film of claim 13, further comprising a step of forming an inversion preventing layer on a bottom of said isolation groove, wherein said insulating film is a silicon dioxide film.

* * * * *